(12) United States Patent
Lande (10) Patent No.: US 7,193,264 B2
(45) Date of Patent: Mar. 20, 2007

(54) FLOATING GATE TRANSISTORS (75) Inventor: Tor Sverre Lande, Baerums Verk (NO)

(73) Assignee: Toumaz Technology Limited, Oxfordshire (GB)

( * ) Notice: Subject to any disclaimer, the term of this patent is extended or adjusted under 35 U.S.C. 154(b) by 0 days.

(21) Appl. No.: 10/532,679

(22) PCT Filed: Oct. 28, 2003

(86) PCT No.: PCT/EP03/50764

§ 371 (c)(1),
(2), (4) Date: Apr. 26, 2005

(87) PCT Pub. No.: WO2004/040658

PCT Pub. Date: May 13, 2004

(65) Prior Publication Data

US 2006/0086969 A1    Apr. 27, 2006

(30) Foreign Application Priority Data

Oct. 30, 2002  (GB) ................................ 0225175.9

(51) Int. Cl.
*H01L 29/76* (2006.01)
(52) U.S. Cl. ................ 257/314; 257/316; 257/E21.68; 365/185
(58) Field of Classification Search ........... 365/185.03, 365/185.05; 257/314, 316, 317, 319
See application file for complete search history.

(56) References Cited

U.S. PATENT DOCUMENTS

| 4,538,287 | A | | 8/1985 | Roberts et al. |
| 5,336,937 | A | | 8/1994 | Sridhar et al. |
| 5,753,950 | A | * | 5/1998 | Kojima ........................ 257/315 |
| 6,509,606 | B1 | | 1/2003 | Merrill et al. |
| 6,515,889 | B1 | * | 2/2003 | Salling et al. .............. 365/145 |
| 2001/0045595 | A1 | | 11/2001 | Black et al. |

FOREIGN PATENT DOCUMENTS

| JP | 4-118965 | 4/1992 |
| JP | 2000-298995 | 10/2000 |
| WO | 95/22201 | 8/1995 |

OTHER PUBLICATIONS

O. Naess et al., "Tunable floating-gate low-voltage transconductor," 2002 IEEE International Symposium on Circuits and Systems. Proceedings (Cat. No. 02CH37353), 22002 IEEE International Symposium on Circuits and Systems, Phoenix-Scottsdale, AZ, USA, May 26-29, 2002, vol. 4, pp. IV-663-IV-666, XP002272572, Piscataway, NJ, USA, IEEE, USA ISBN: 0-7803-7448-7.

* cited by examiner

*Primary Examiner*—Thao X. Le
*Assistant Examiner*—Mursalin B. Hafiz
(74) *Attorney, Agent, or Firm*—Wenderoth, Lind & Ponack, L.L.P.

(57) ABSTRACT

A floating gate MOS transistor comprises one or more control gates, an active channel, and at least one floating gate disposed between the control gate(s) and the active channel. First and second non-linear resistances couple the floating gate to first and second control voltage sources respectively, the non-linear resistances forming a voltage divider network which sets the operating voltage of the floating gate.

15 Claims, 6 Drawing Sheets

PRIOR ART

FLOATING GATE TRANSISTORS

BACKGROUND OF THE INVENTION

The present invention relates to floating gate transistors and more particularly to floating gate metal-oxide-semiconductor transistors.

Floating gate metal-oxide-semiconductor (MOS) transistors are devices with a first gate situated on a layer of insulating oxide directly above the transistor channel, and a second control gate situated on a layer of insulating oxide above the first gate. The first gate is electrically isolated, hence the term 'floating gate', and any charge deposited on the floating gate will be held almost indefinitely. Floating gate devices are commonly used in digital integrated circuit (IC) design as the storage components of FLASH EPROM. Typically, floating gate MOS transistors are fabricated using thin film technology, with a high degree of integration between transistors and other components.

During the last decade, floating gate devices have also been exploited in analogue IC design to implement circuits and small systems. The availability of a floating gate device, where the charge (or voltage) on the floating gate can be controlled, leads to a number of useful circuit applications, including:

Analogue memory: Floating gate devices can be used as 'analogue PROM', particularly for applications such as neural networks which require non-volatile analogue storage.

Tuning: Any charge stored on the floating gate will affect the threshold voltage of the transistor. Thus transistors can effectively be tuned to ensure their threshold voltages are equal, by carefully controlling the charge stored on the floating gate. A further example is the auto-zero floating gate amplifier (AFGA), where the operating point at the input of the amplifier can be set by tuning a floating gate structure.

Level shifting: The floating gate is also a level shifter. Whatever charge is stored on the floating gate will add to the voltage applied on the control gate. This level shifting may be used (for example) for threshold shifting for tow-power low voltage circuits. With a preset voltage offset, the functional threshold of the transistor is changed accordingly.

Figure 1A:
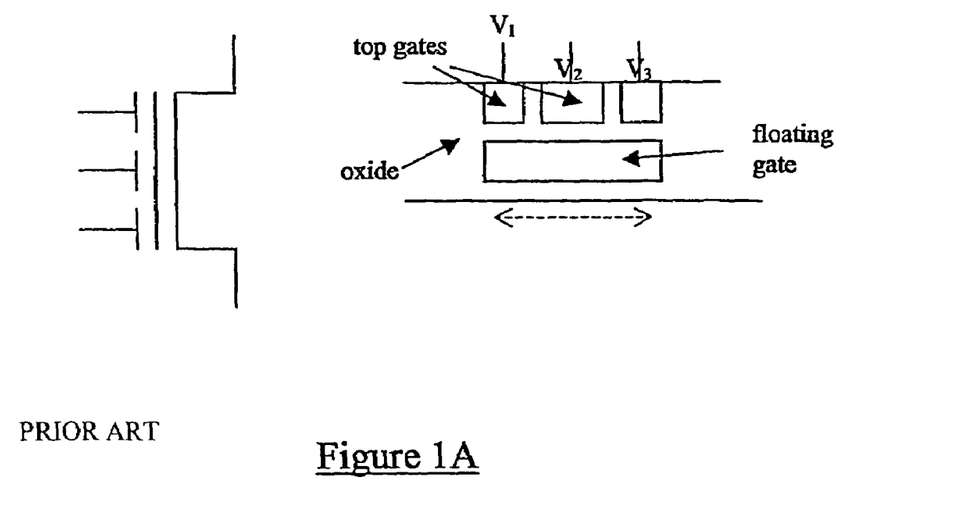
FIG. 1A illustrates schematically and in cross section a stacked floating gate MOS transistor.
Figure 1B:
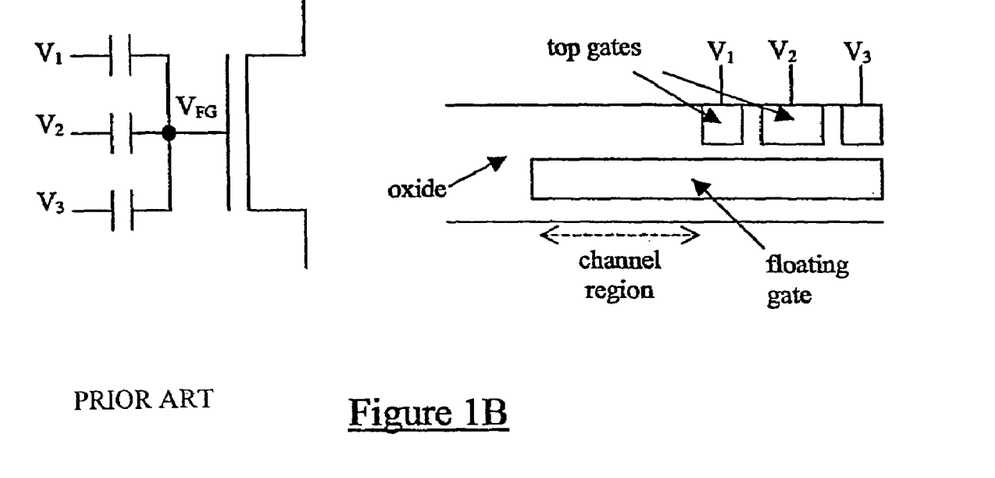
FIG. 1B illustrates schematically and in cross-section a floating gate MOS structure with the top gate offset from the channel.

Computation: The use of the floating gate transistor as a computational element is very attractive for low power analogue integrated circuit design. If the top (control) gate is divided into a number of smaller gates with scaled areas, the floating gate device effectively performs a weighted summation of the voltages applied on each of these top gates. By scaling the top gate areas (i.e. capacitor sizes) voltages can be weighted, relative to the capacitor sizes. Such a structure is indicated diagrammatically in FIG. 1. FIG. 1a represents a stacked floating gate device, where the top control gate (or gates) is (or are) situated directly above the channel region of the transistor. However such a stacked floating gate structure is not recommended, as the process steps required to fabricate the top gate can cause changes in the floating gate and substrate which affect the transistor's threshold voltage. The preferred architecture is shown in FIG. 1b, where the floating gate is extended laterally from the channel, and the top gate is deposited over this extended region.

An informative review of both digital and analogue applications based on floating gates can be found in: IEEE Transaction on Circuits and Systems—Part II, Special Issue on Floating Gate Circuits and Systems, January 2001.

Despite the obvious attractions, the usage of floating gate structures in analogue circuits has not really taken off, due to a number of practical problems in the implementation of analogue floating gate circuits. In particular, programming and control of the charge on the floating gate is very difficult, and typically involves a combination of Fowler-Nordheim tunnelling and hot carrier injection. Both of these processes typically require the application of large voltages which allow electrons with sufficient energy to tunnel through the insulating silicon dioxide to and/or from the floating gate, thus altering the net charge on the gate. Although this process is similar to the methods used for programming and erasing digital ROMs, repeated programming causes degradation of the silicon oxide leading to transistor breakdown. This leads to long-term reliability problems for circuits which require constant tuning or alteration. In addition the application of high voltages to perform tuning is itself undesirable.

Another problem with floating gate devices is that the long-term charge storage capabilities are uncertain—over time the charge stored on the floating gate may slowly leak away. This problem will only get worse as process dimensions shrink and the oxide thickness reduces. Any slight charge leakage in a digital memory may not be a problem but is much more significant when an analogue value is being stored. This uncertainty in long-term charge storage has contributed to the reluctance to exploit floating gates in analogue ICs for commercial applications.

Figure 2:
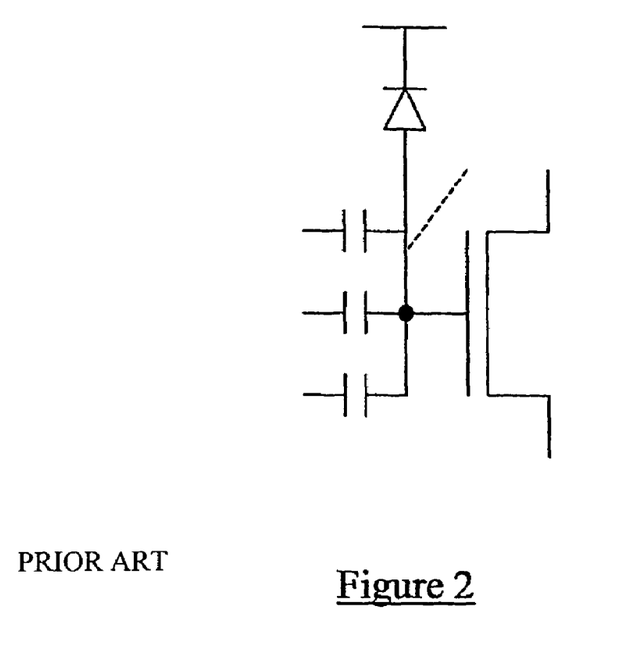
FIG. 2 shows an equivalent circuit for a floating gate transistor including a prior art mechanism for setting the floating gate operating voltage.

Recently, a mechanism for overcoming the above-mentioned problem in floating gate analogue circuit design—i.e. the difficulty in manipulating the charge stored on the floating gate—was proposed at IEEE Int. Symposium on Circuits and Syst. (ISCAS) 2001, Pre-Conference Workshops: 'Multiple-Input Floating-Gate MOS Transistors as Functional Devices to Build Computing Circuits' Tadashi Shibata, 'Voltage-Mode Floating Gate Circuits', Jaime Ramirez-Angulo. The mechanism involves the deliberate addition of a small leakage path to the floating gate (although in this architecture the gate is no longer truly "floating", that terminology is still used for convenience). Such a leakage path could be provided using a high resistance value implemented using conventional CMOS resistors. However, this would require a prohibitively large silicon area, and thus is impractical. Shibata and Ramirez-Angulo therefore propose providing the leakage path via the addition of a single pull-up reverse biased diode clamping the floating gate potential to the positive supply rail, as shown in FIG. 2. The reverse-biased diode effectively acts as a very large resistor which pulls the voltage on the floating gate toward the voltage applied to the other end of the diode (in this case, the supply voltage). The voltage on the floating gate will respond to voltages applied to the top gate(s), deviating from the voltage of the positive supply rail for as long as the gate voltage(s) is(are) applied.

This simple mechanism, however, has severe limitations. Input signal perturbations of sufficient amplitude will forward bias the pull-up diode, introducing severe distortion into the device performance. Restricting the signal swing to well below one diode offset should reduce this effect, but the forward conduction problem can never be eliminated entirely.

SUMMARY OF THE INVENTION

It is an object of the present invention to overcome the above disadvantages.

According to a first aspect of the present invention there is provided a floating gate MOS transistor comprising:
one or more control gates;
an active channel;
at least one floating gate disposed substantially between the control gate(s) and the active channel;
first and second non-linear resistances coupling the floating gate to first and second control voltage sources respectively, the resistances forming a voltage divider network which sets the operating voltage of the floating gate.

The term "floating gate" is used here by convention, and indicates that the gate will provide floating gate functionality. The gate is not truly floating as it is coupled by the non-linear resistances to the voltage sources.

Providing that the non-linear resistances are sufficiently large in value, leakage from the floating gate to the voltage sources is relatively small. For short term fluctuations in the voltage(s) applied to the control electrode(s), the floating gate acts as a true floating gate.

In a preferred embodiment of the present invention, said non-linear resistances are provided by respective diodes, or transistors operating as diodes, with the voltages applied to the first and second voltage sources being defined so that in use the diodes are reverse biased. It will be appreciated however that other means may be used to provide the resistances.

According to a second aspect of the present invention there is provided an electronic device comprising one or more floating gate transistors according to the first aspect of the present invention.

In certain embodiments of the present invention, the electronic device comprises means for varying the voltage applied to one or both of the first and second control voltage sources. This allows the operating voltage of the floating gate to be tuned to an appropriate value.

According to a third aspect of the present invention there is provided a method of operating the floating gate transistor of the first aspect of the invention, the method comprising applying first and second fixed voltages to the first and second voltage sources respectively. The floating gate can be set to a desired operating voltage by an appropriate selection of the first and second voltages.

According to a fourth aspect of the present invention there is provided a method of operating the floating gate transistor of the first aspect of the invention, the method comprising applying first and second voltages to the first and second voltage sources respectively, at least one of the first and second voltages being variable. The voltage at which the floating gate is operated can be set to a desired value by tuning one or both of the first and second voltages.

The use of a reverse biased diode to provide a high resistance connection between a floating gate and a control voltage source has the potential drawback that it may take a relatively long time to charge the floating gate to the operating voltage following, for example, power-up.

It is a further object to overcome this disadvantage, and to enable the floating gate to charge to an operating voltage in a relatively short time.

According to a fifth aspect of the present invention there is provided a floating gate MOS transistor comprising:
one or more control gates;
an active channel;
at least one floating gate disposed substantially between the control gate(s) and the active channel;
at least one resistance coupling the floating gate to a voltage source, the resistance being provided by a MOS transistor having its gate and source connected together, the transistor source being coupled to said voltage source and the transistor drain being coupled to the floating gate.

Preferably, the transistor gate is coupled to the transistor source via a resistance. This resistance may be provided by a short length of polysilicon.

According to a sixth aspect of the present invention there is provided a floating gate MOS transistor comprising:
one or more control gates;
an active channel;
at least one floating gate disposed substantially between the control gate(s) and the active channel;
an insulating region surrounding the floating gate or a contact coupled to the floating gate; and
a conductor at least partially surrounding said insulating region, wherein in use the conductor is coupled to an operating voltage.

The insulating region will permit charge leakage from the floating gate to a very small extent. However, providing that this leakage is sufficient, the floating gate will charge to the operating voltage. The leakage through the insulating layer can be enhanced to a sufficient degree by forming a contact on the floating gate, since the fabrication steps contributing to the formation of this metal contact to the floating gate cause impurities to damage the inter-oxide (insulating) layers, thus providing a mechanism for charge transport.

In one embodiment of the present invention, a metal contact is formed on the floating gate, a charge leakage path extending between the metal contact and said conductor. Preferably, the floating gate extends laterally from above the active channel, and said metal contact is formed on the floating gate at the end of the gate remote from the active channel. More preferably, said conductor surrounds an insulating region surrounding said metal contact and the adjacent portion of the floating gate.

BRIEF DESCRIPTION OF THE DRAWINGS

For a better understanding of the present invention and in order to show how the same may be carried into effect reference will now be made, by way of example, to the accompanying drawings in which:

FIG. 6b illustrates in cross-section the floating gate transistor structure of FIG. 6a;

DETAILED DESCRIPTION OF THE INVENTION

Prior art floating gate MOS transistors have been described above with reference to FIGS. 1 and 2. Whilst the architecture illustrated in FIG. 2 provides an improvement over that of FIG. 1, that architecture is not ideal because of limitations which it imposes on the voltage(s) which can be applied to the control gate(s).

Figure 3:
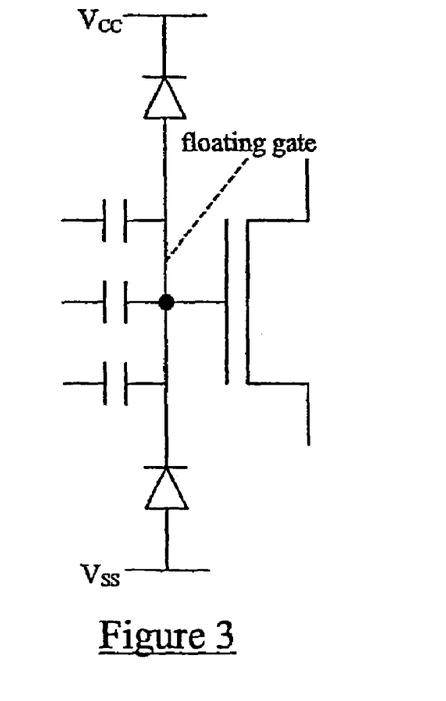
FIG. 3 shows an equivalent circuit for a floating gate transistor including an improved mechanism for setting the floating gate operating voltage.

An improvement to the architecture of FIG. 2 involves the use of two reverse biased diodes (pn junctions) connected to the floating gate as shown in FIG. 3. These diodes can be connected directly to the power rails $V_{CC}$, $V_{SS}$ which will thus set an operating point somewhere between the two power supply rails. The diodes operate as non-linear resistances. By manipulating the relative diode dimensions, one of the diodes can be made 'dominant', thus defining the power rail which the operating point will approach. Knowing the expected input voltage swing, the divider voltage may be set accordingly. Imposing a voltage perturbation on this structure within the expected limits should not forward bias the diodes. Thus compared to the single diode pull-up, the reverse diode voltage divider architecture will ensure a distortion free operation.

A more general solution is to use two separate tuning voltages connected to the other terminals of the reverse-biased diodes, instead of connecting these points to the supply rails. The floating gate voltage will then be determined by these tuning voltages, and effectively this will set the operating voltage of the transistors. This technique is general and applicable both for analogue and digital circuits, and may be implemented in any standard CMOS process. The penalty of course is extra connections and tuning voltages. An intermediate solution would be to have only one extra tuning voltage, and to connect the other diode terminal to one of the supply rails.

A feature of the leaky floating gate approach is that very high resistance values are required to minimize the amount of leakage and ensure that the device still behaves during normal operation as a floating gate structure. The downside of this is that devices using this mechanism possess long turn-on times during power up. Since the floating gate capacitance must be charged up through the very high resistance, power-up times of the order of minutes may result. This is clearly impractical for many applications.

Figure 4:
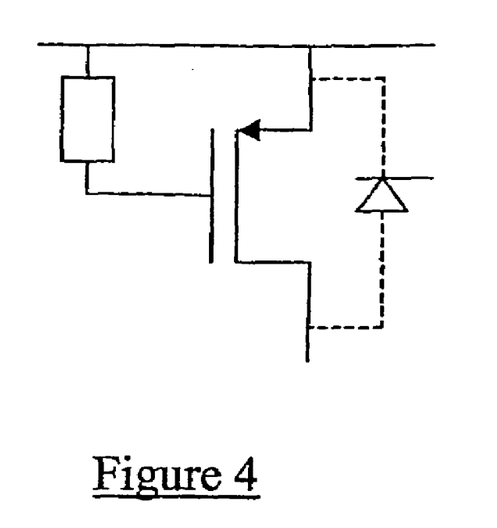
FIG. 4 shows a MOS transistor configuration for providing a resistance in the transistors of FIGS. 2 and 3.

A proposed solution is to implement the reverse biased diode (leaky resistor) using a MOS transistor with gate-source shorted (see FIG. 4). In normal operation the transistor will be off, and the only current flowing will be the leakage current of the drain diffusion (i.e. diode leakage as desired). However at power-up the MOS transistor will quickly 'bootstrap' the floating gate to the desired operating voltage, assuming that during power-up the MOS gate potential rises more slowly than the source potential. This situation is likely to occur since the gate capacitance is much higher that the source capacitance, thus the gate potential will automatically lag the source potential. However, to ensure that this 'bootstrap' effect happens, the bootstrap MOS gate should be connected to the positive supply rail through a length of polysilicon, which effectively implements a small resistor in series with the gate, thus further delaying the gate rise time. It will be appreciated that this shorted-gate MOS structure can be used both in the novel architecture of FIG. 3 and in the prior art architecture of FIG. 2, as well as in other floating gate MOS architectures.

In the circuits discussed above, reverse-biased diodes (and MOS transistors arranged to operate as diodes) are used to implement very high resistance structures to ensure that the floating gates are made only very slightly leaky. Although reverse biased diodes offer large resistance in a relatively small silicon area, they do not exhibit ideal resistive behaviour (due e.g. to leakage currents).

It is known that in order to achieve good isolation, a floating gate must be made as a single piece of polysilicon. If a metal contact is deposited on top of the floating gate, the processing steps required cause changes in the oxide interface, allowing a small amount of charge transport to occur. The nearest contact to this floating gate will collect this charge, and thus the floating gate now has a direct leakage path. Over time, the voltage on the floating gate will thus settle to the potential on this nearby contact.

A solution proposed here is to exploit this (usually unwanted) effect by making a contact to the floating gate, thus "damaging" the surrounding oxide and introducing a transport path for electrons. The floating gate is then surrounded with a second contact which thus collects all of the floating gate leakage charge which flows along the electron transport. Effectively, an ohmic contact to the floating gate is formed, the resistance being the very high resistance of the oxide interface layers. The surrounding contact is coupled to a voltage source, set to the desired operating voltage.

The process steps for fabrication of a conventional floating gate device will vary depending on the process technology and production methods. A simplified procedure which outlines in brief the main process steps for formation of the floating gate is as follows:

1. Thick field oxide is deposited and etched to define the source, drain and channel regions. Thin gate oxide is deposited over the whole device, and then etched away from source and drain regions. Source and drain regions are diffused (n-type or p-type implant for NMOS/PMOS devices respectively).
2. Polysilicon is deposited on top of the thin gate region (self-aligned gate) to form the floating gate.
3. Field oxide and gate oxide layers are deposited to insulate the floating gate.
4. Polysilicon for the second gate (control gate) is deposited on top of the second thin gate oxide layer. Field oxide is then deposited over the complete device, with windows being etched to allow contact to the source, drain and control gates.

Figure 5:
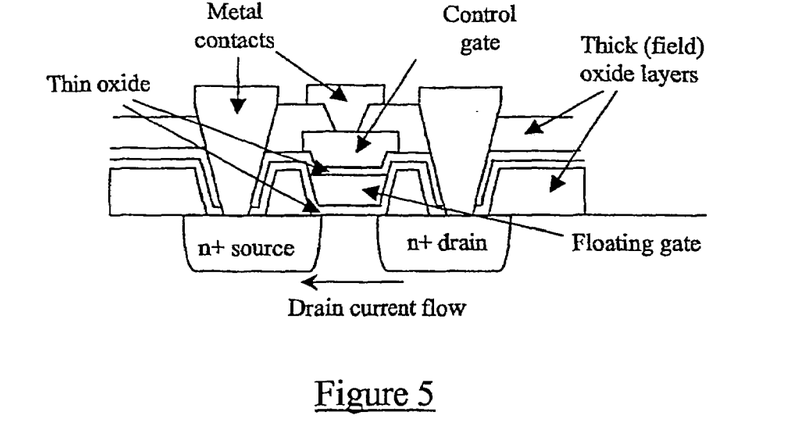
FIG. 5 illustrates a known floating gate MOS transistor structure.

The basic device structure of such an NMOS floating gate device is illustrated in FIG. 5—note that dimensions are not to scale. FIG. 5 shows a cross-sectional view of the transistor along the channel.

If a metal contact is made to the floating gate during the fabrication process, the fabrication procedure is now modified as follows:

1. Thick field oxide is deposited and etched to define the source, drain and channel regions. Thin gate oxide is deposited over the whole device, and then etched away from source and drain regions. Source and drain regions are diffused (n-type or p-type implant for NMOS/PMOS devices respectively).
2. Floating polysilicon gate deposited as before, but the gate region is extended to allow additional area for metal contact to be made.

3. Field and thin oxide layers are deposited, and etched to form a window for the floating gate metal contact. The metal contact is deposited, and covered with a further layer of thick oxide. When a layer of silicon diode is deposited on top of an existing layer, a solid insulator is formed but with a minor systematic "crack" between the layers. The etching process leaves impurities along this interface, thus allowing a small amount of charge transport to occur along this inter-dioxide layer.

Figure 6A:
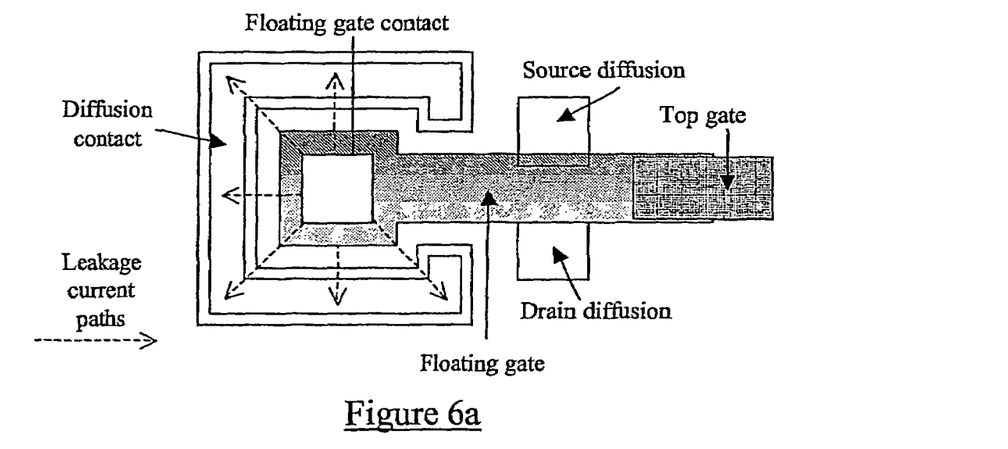
FIG. 6a illustrates in plan view a floating gate transistor structure with a deliberate leakage path introduced by the formation of a metal contact to the floating gate.
Figure 6B:
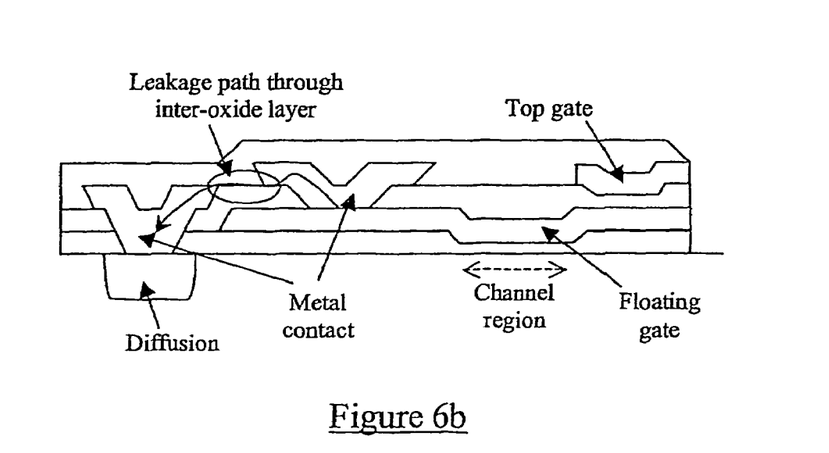

A suitable layout for this architecture is shown schematically in FIG. 6, with FIG. 6a showing a plan view and FIG. 6b a cross-sectional view. Note that the cross section in FIG. 6b is now perpendicular to the channel (i.e. current in the channel flows into the plane of the paper). A 'stand-alone' metal contact is made to the floating gate. A diffusion (active) contact is made surrounding the floating gate. This second contact will collect most of the gate leakage charge since diffusion contacts are deep, extending all the way down to the substrate. As shown in FIG. 6, it is impossible to enclose the floating gate contact completely. However, with the illustrated layout close to 80% of the edge should be controlled. The surrounding contact should be made as close as possible to the floating gate in order to reduce the resistive value which otherwise might be too large even for floating gates.

Figure 7:
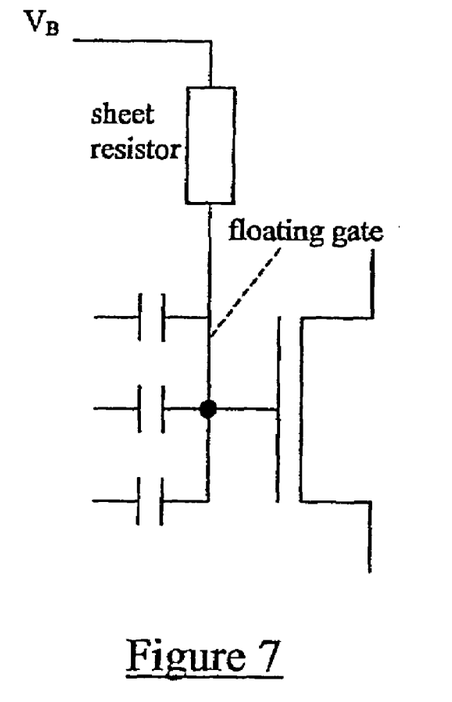
FIG. 7 shows an equivalent circuit for the floating gate transistor of FIG. 6.

Applying this structure to the leaky floating gate circuit will make the resulting circuit simpler since now only a single resistive connection is required to the floating gate, as shown in FIG. 7.

The architectures described above are usable in both analogue and digital circuits. In digital circuits an important use would be to allow the tuning of threshold voltages of the transistors. Assuming all devices are made with leaky gate structures, the thresholds of the devices may be tuned to close to 0V allowing for much lower supply voltages. Supply voltages between 0.5–1 V have been demonstrated in standard high-threshold CMOS with more complicated, UV-based floating gate tuning techniques. Many different kinds of gates may be designed and it is anticipated that the area-penalty for using these devices is small. Device count is usually reduced, whilst stacked transistors may be replaced with a single transistor having dual control gates.

In conventional digital logic, multiple input logic gates are formed typically by vertically stacking a number of N and P-type transistors. The minimum supply voltage is thus limited by the need to provide sufficient voltage headroom for these stacked devices. However by using multiple-input floating gate transistors we may reduce the stacking to only two stacked transistors, one PMOS on top of one NMOS. The multiple input logic gate functionality can then be implemented through exploiting the multiple-input functionality of the floating gate transistors. This allows very low supply voltages to be used.

In analogue circuits the leaky gate structures may be used in a number of ways. Circuit biasing is simplified and the capacitive connections through a double poly capacitor enable an external operating voltage. Another property of floating-gate like structures is the perfect voltage summing features. This summing structure could be used for mixing signals. As with digital circuits, the threshold shifting ability is useful for low power, low voltage analogue circuits. The free headroom towards the rails may be regained, enabling a full rail-to-rail operation of circuits.

Figure 8:
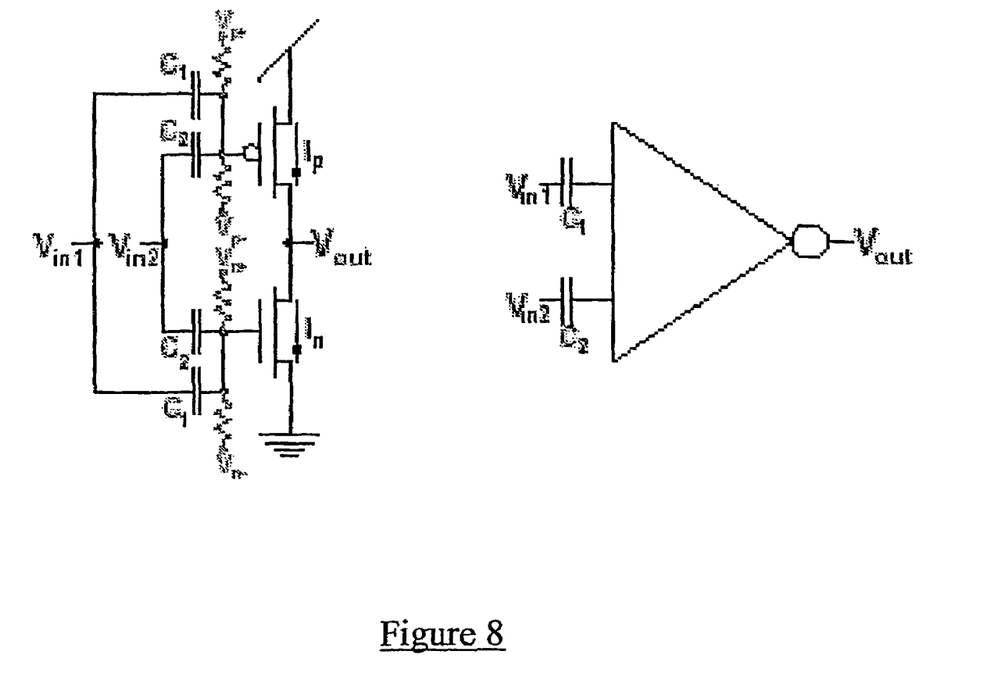
FIG. 8 shows an equivalent circuit of an additive inverter constructed using floating gate transistors.

FIG. 8 illustrates an equivalent circuit for an additive inverter using floating gate transistors. The two-input additive inverter circuit functions as a standard one-input inverter except that it has an additive property where the inverting threshold is given by the sum of the input voltages. The transconductance of the inverter can be tuned by varying the offset voltage(s) of the floating gate transistor. If we connect the output node to one of the inputs, and the coupling capacitances are of equal sizes, the circuit behaves as an analog inverter, or analog inverting amplifier with gain=1.

Figure 9:
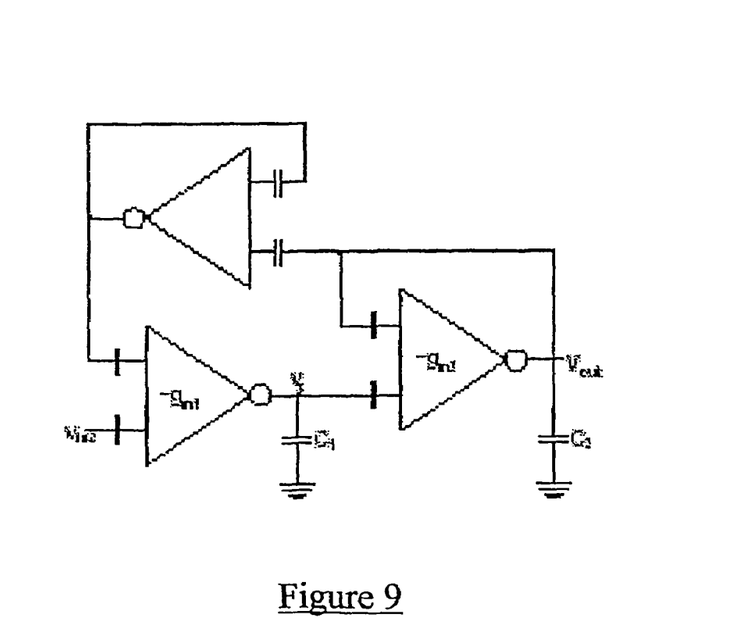
FIG. 9 shows an equivalent circuit of a biquadratic structure comprising additive inverters according to FIG. 8.

FIG. 9 illustrates a biquadratic structure consisting of three identical additive inverters, each as illustrated in FIG. 8, and two filter capacitors. The structure resembles a standard second order biquad structure, except that the node voltage is inverted from the input voltage, and the output voltage is inverted from the node voltage. When the output is fed back to the input inverter, the signal must be inverted. This is done by using an analog inverter coupling.

An example application of the technology described here is in the field of hearing aids. By cascading several second order biquads and separately tuning the cutoff frequency and Q-factor of each stage, it is possible to emulate the behavior of a human cochlea.

It will be appreciated by the person of skill in the art that various modifications may be made to the above described embodiments without departing from the scope of the present invention.

The invention claimed is:

1. A floating gate MOS transistor comprising:
   one or more control gates;
   an active channel;
   at least one floating gate disposed substantially between the active channel and the one or more control gates;
   first and second non-linear resistances coupling the floating gate to first and second control voltage sources respectively, the resistances forming a voltage divider network which sets the operating voltage of the floating gate.

2. A transistor according to claim 1, wherein said non-linear resistances are provided by respective diodes, with the voltages applied to the first and second voltage sources being defined so that in use the diodes are reverse biased.

3. An electronic device comprising one or more floating gate transistors according to claim 1.

4. An electronic device according to claim 3, wherein the electronic device comprises means for varying the voltage applied to one or both of the first and second control voltage sources so that the operating voltage of the floating gate can be tuned to an appropriate value.

5. A method of operating the floating gate transistor of claim 1, the method comprising applying first and second fixed voltages to the first and second voltage sources respectively so as to set the floating gate to a desired operating voltage by an appropriate selection of the first and second voltages.

6. A method of operating the floating gate transistor of claim 1, the method comprising applying first and second voltages to the first and second voltage sources respectively, at least one of the first and second voltages being variable so that the voltage at which the floating gate is operated can be set to a desired value by tuning one or both of the first and second voltages.

7. A floating gate MOS transistor comprising:
   one or more control gates;
   an active channel;
   at least one floating gate disposed substantially between the active channel and the one or more control gates;
   at least one non-linear resistance coupling the floating gate to a voltage source, the non-linear resistance being provided by a MOS transistor having its gate and source connected together, the transistor source being coupled to said voltage source and the transistor drain being coupled to the floating gate.

8. A transistor according to claim 7, the transistor gate being coupled to the transistor source via a resistance.

9. An electronic device comprising one or more floating gate transistors according to claim 2.

10. A method of operating the floating gate transistor of claim 2, the method comprising applying first and second fixed voltages to the first and second voltage sources respectively so as to set the floating gate to a desired operating voltage by an appropriate selection of the first and second voltages.

11. A method of operating the floating gate transistor of claim 2, the method comprising applying first and second voltages to the first and second voltage sources respectively, at least one of the first and second voltages being variable so that the voltage at which the floating gate is operated can be set to a desired value by tuning one or both of the first and second voltages.

12. A transistor according to claim 1, wherein said non-linear resistances comprise respective transistors operating as diodes, with the voltages applied to the first and second voltage sources being defined so that in use the diodes are reverse biased.

13. An electronic device comprising one or more floating gate transistors according to claim 12.

14. A method of operating the floating gate transistor of claim 12, the method comprising applying first and second fixed voltages to the first and second voltage sources respectively so as to set the floating gate to a desired operating voltage by an appropriate selection of the first and second voltages.

15. A method of operating the floating gate transistor of claim 12, the method comprising applying first and second voltages to the first and second voltage sources respectively, at least one of the first and second voltages being variable so that the voltage at which the floating gate is operated can be set to a desired value by tuning one or both of the first and second voltages.

* * * * *